United States Patent [19]

Edwards

[11] 4,333,166
[45] Jun. 1, 1982

[54] SEMICONDUCTOR MEMORY CIRCUITS

[75] Inventor: Colin W. Edwards, Lightwater, England

[73] Assignee: Hughes Aircraft Company, Culver City, Calif.

[21] Appl. No.: 101,968

[22] Filed: Dec. 10, 1979

[51] Int. Cl.³ ............................................. G11C 11/40
[52] U.S. Cl. ................................... 365/182; 365/149; 365/154; 365/174; 365/203
[58] Field of Search ............... 365/149, 154, 155, 156, 365/174, 182, 184, 222, 228, 203

[56] References Cited

U.S. PATENT DOCUMENTS 4,271,487  6/1981  Craycraft et al. .................... 365/222

Primary Examiner—Terrell W. Fears
Attorney, Agent, or Firm—J. Holtrichter, Jr.; W. H. MacAllister

[57] ABSTRACT

A non-volatile semiconductor latch having at least one variable threshold FATMOS transistor in the cross-coupled latch branches. To accomplish non-volatile reading, the latch nodes ($X_1$, $X_2$) are briefly precharged positively so that when the precharging ends and the nodes descend towards the negative supply voltage, the FATMOS(s), by virtue of their varied thresholds, place the latch in its correct logic state dictated by an earlier non-volatile write operation. Precharging, by means of transistors $Q_7$, $Q_8$ in parallel with the complementary drivers or loads, and transistors $Q_9$, $Q_{10}$ in series with the drivers in the latch, negates the capacitive effects which can otherwise cause unpredictable non-volatile reading. It also enables non-volatile reading to occur independently from power switch-on—which was necessary with earlier non-volatile FATMOS-containing latches.

17 Claims, 3 Drawing Figures

SEMICONDUCTOR MEMORY CIRCUITS

FIELD OF THE INVENTION

This invention relates to semiconductor memory circuits which have the capability of retaining stored information even after electrical power to the circuit has been removed.

BACKGROUND OF THE INVENTION

Semiconductor memories can be classified as volatile (where stored information is lost upon power removal) and non-volatile (where stored information is maintained after power removal, and which can be accurately retrieved upon subsequent power-up). Several types of non-volatile semi-conductor memories are known, notably based on MNOS transistors, FAMOS transistors, or FATMOS transistors. A description of prior MNOS and FAMOS memory circuits is given in U.S. Pat. No. 4,132,904. The latter patent, together with U.K. Specification No. 2,000,407 describe and claim FATMOS non-volatile latch memory circuits.

The FATMOS is basically a control gate plus floating gate MOS transistor with a portion of the floating gate lying close to the semiconductor substrate. When the source and drain connections are connected to an appropriate potential (one positive relative to the other) and a suitable potential of a first magnitude applied to the control gate, the transistor conducts. Upon removal of the control gate potential, conduction ceases. If a potential of a second and higher magnitude is applied to the control gate with the drain at zero voltage, the transistor again conducts, but in addition electric charges tunnel between the floating gate and the transistor substrate through the portion of the floating gate closest to the substrate. This charge remains on the floating gate even when the control gate potential is removed and increases the switching threshold of the device. This charge on the floating gate enables the transistor to be employed in a non-volatile memory, as described in U.K. Specification No. 2,000,407. The switching threshold of the FATMOS is returned to its original level by applying between the control gate and drain a potential of approximately the second and higher potential, but of opposite sign.

In a typical example of an N-channel enhancement-type FATMOS, the area of the floating gate closest to the substrate overlies the drain of the transistor, although this is not essential and the area closest to the substrate can be elsewhere on the transistor. In normal, non-volatile operation of a latch including such a FATMOS device, a voltage of typically +5 to +7 volts is applied to the control gate of the FATMOS. To write non-volatile information into the latch, a voltage of typically +8 to +15 volts is applied to the control gate of the FATMOS. If power is removed from the latch and then subsequently restored, it settles into a logic state dictated by its state during the earlier non-volatile write operation. In fact, the logic state it settles into is opposite to the state which existed at non-volatile write.

Although FATMOS transistors work well when employed in non-volatile memory cells (see U.K. Specification No. 2,000,407) they can sometimes be unpredictable during power-up after the FATMOS's have been placed in their non-volatile mode (higher threshold state). This unpredictablity manifests itself by the FATMOS transistor(s) switching to the wrong state (i.e. a FATMOS with a charge retained on its floating gate being held "off" instead of "on" and vice-versa). The explanation for this appears to arise from the processing conditions employed to produce the N+ diffusion areas. These have a higher capacitance per unit area than other semiconductor areas, and the consequence is that the device has more nodal capacity to the negative supply line than the positive line. If, for example, one examines the CMOS non-volatile memory cell illustrated in FIG. 2a of U.S. Pat. No. 4,132,904 (which employs a pair of FATMOS drivers in a cross-coupled latch configuration), the capacitance which exists between N1 and N2 to the more negative supply rail ($V_{SS}$) is greater than the corresponding capacitance to the more positive supply rail $V_{DD}$. Thus, when the cell is switched on after the FATMOS transistors ($Q_2$ and $Q_4$) have been placed in their varied threshold states, the P-channel complementary driver or load transistors ($Q_1$ and $Q_3$) switch on faster than the FATMOS devices. They will thus make a decision regarding conduction states ahead of the FATMOS devices. The latter transistors may therefore possibly be driven into the incorrect states and are thus incapable of steering the latch into its correct, non-volatile memory state.

The present invention is concerned with reducing this unpredictability during non-volatile read and is also concerned with enabling the non-volatile information written into the memory to be recovered without the need for the cycle of removing and then restoring the power to the latch.

SUMMARY OF THE INVENTION

The present invention reduces such unpredictability as described by precharging the nodes of the latch at the commencement of a non-volatile read to a logic state such that, when the precharge signal is removed, the FATMOS devices switch ahead of the non-variable threshold transistors in the latch. They will thus dictate, by means of their different thresholds, the correct logic state into which the latch should settle.

According to the invention there is provided a non-volatile bistable semiconductor latch having a pair of cross-coupled branches connectable across a common supply voltage, each branch including a complementary driver or load and a driver connected in series at a respective node, at least one of said complementary drivers or loads, or drivers, including an insulated gate field effect transistor (IGFET) having a threshold voltage which may be varied by raising its gate potential above a predetermined level relative to the potential on one of its other electrodes, whereby volatile information stored in said latch is rendered non-volatile by increasing said gate potential above said predetermined level, and means for precharging both said nodes to an identical logic state such that, when the precharge signal is removed, at least one variable threshold IGFET switches in a direction to place the latch in the correct logic state dictated by an earlier non-volatile storing operation.

BRIEF DESCRIPTION OF THE DRAWINGS

Preferred features of the invention will now be described with reference to the accompanying drawings, given by way of example, wherein.

DESCRIPTION OF THE PREFERRED EMBODIMENTS

Figure 1:
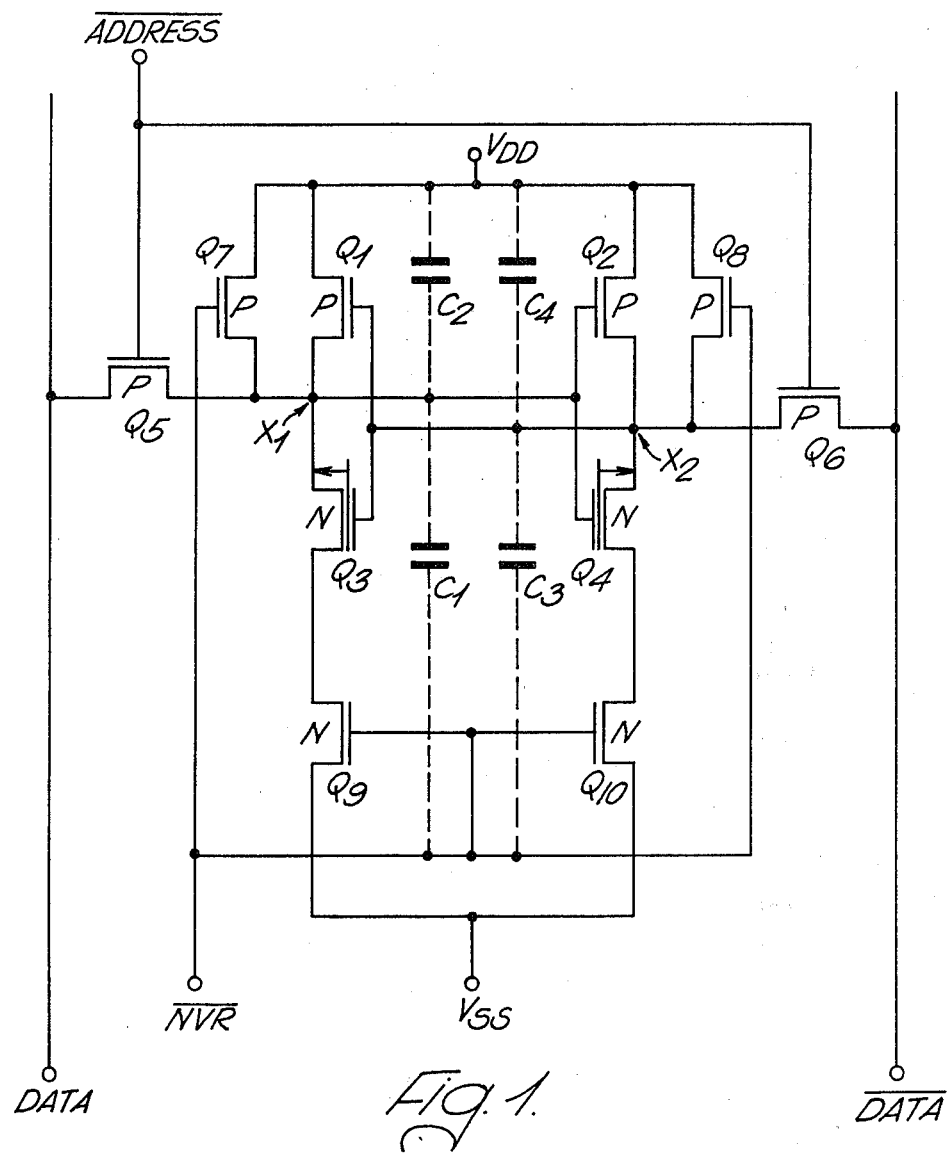
FIG. 1 is an electrical circuit diagram of a first embodiment of the invention.

Referring first to FIG. 1, there is shown a CMOS non-volatile latch circuit having P-channel complementary drivers (or loads) $Q_1$, $Q_2$, N-channel drivers constituted by FATMOS devices $Q_3$, $Q_4$ and read/write control N-channel MOS transistors $Q_5$ and $Q_6$. The control gates of the transistors $Q_1$ to $Q_4$ are cross-coupled to the nodes of each opposite branch of the cell, such nodes being indicated as $X_1$ and $X_2$. Transistors $Q_5$, $Q_6$ link the latch to DATA and $\overline{\text{DATA}}$ lines for information input/output and are controlled by an ADDRESS signal as shown. The notional capacitances between the nodes and the supply rails $V_{DD}$, $V_{SS}$ are indicated by dashed lines and capacitors $C_1$ to $C_4$. As so far described, the cell is identical to that illustrated in FIG. 2a of U.S. Pat. No. 4,132,904 and U.K. Pat. Specification No. 2,000,407, and thus a detailed description of its volatile and non-volatile operational states will not be given here—the reader being referred to either of the referenced patent specifications for details.

Before describing the inventive aspects of FIG. 1, the possible unpredictability of the circuit will be explained. At power-up, which is required for a non-volatile read operation, the FATMOS devices $Q_3$ and $Q_4$ will have different thresholds as a consequence of the charges stored on the floating gates from an earlier non-volatile write operation. This characteristic should therefore force the latch into an unambiguous memory state upon power-up. However, as has already been explained, the N+ diffusion areas have a high capacitance per unit area and thus $C_1 > C_2$ and $C_3 > C_4$. When is applied to the cell, $V_{DD}$ separates from $V_{SS}$ and because of the capacitance ratios mentioned, the nodes $X_1$ and $X_2$ initially lie close to $V_{SS}$ (the negative supply rail). This turns the P-channel transistors $Q_1$, $Q_2$ on and tends to hold the FATMOS drivers $Q_3$, $Q_4$ off. The nodes commence moving towards the positive supply rail voltage, $V_{DD}$, and at some point one of the nodes must give up so that the latch settles into a stable logic state (one node being "0", the other being "1"). Ideally the different thresholds of the FATMOS transistors should determine this end result, but because these devices are initially nearly off, the stable latch state can be dictated by the slight differences between the two P-channel transistors $Q_1$, $Q_2$. The latch may therefore settle into a stable logic state not dictated by the FATMOS devices.

Reverting now to the inventive aspects of the circuit shown in FIG. 1, this unpredictability is removed by adding P-channel transistors $Q_7$, $Q_8$ in parallel with the P-channel complementary loads $Q_1$, $Q_2$ and by adding N-channel transistors $Q_9$, $Q_{10}$ in series with the FATMOS loads $Q_3$, $Q_4$. The control gates of these transistors are operated by a common control signal designated $\overline{\text{NVR}}$.

Assume now that non-volatile information has already been written into the latch as previously described. To read this information, rather than removing and then restoring the power to the latch, a negative signal pulse is applied to the $\overline{\text{NVR}}$ terminal. This immediately turns on $Q_7$, $Q_8$, turns off $Q_9$, $Q_{10}$, and causes both nodes $X_1$, $X_2$ to go positive. At this stage the FATMOS devices $Q_3$, $Q_4$ are on, but are isolated from the negative supply rail $V_{SS}$, and $Q_1$, $Q_2$ are held off. When the $\overline{\text{NVR}}$ signal is removed, $Q_7$, $Q_8$ commence to go off, $Q_9$, $Q_{10}$ commence to go on, and the nodes $X_1$, $X_2$ start to descend towards the negative supply voltage. At this time, also, the FATMOS devices $Q_3$, $Q_4$ start to switch on, but due to their variable thresholds one turns on faster than the other and dictates the stable state into which the latch settles. In this manner, the FATMOS transistors have maximum effect during this unstable period and the capacitance effects described are negated. A further advantage of precharging the latch nodes positively at a non-volatile read operation by means of the $\overline{\text{NVR}}$ signal is that the non-volatile stored information can be recovered at any time independently of the power supply switch on. Not only is this more convenient, but also enables design constraints on the power supply to be reduced. Reading can occur repeatedly (to bring back the previously non-volatile written information) without requiring power switch-off each time.

If desired, $Q_9$ and $Q_{10}$ may be combined into a single device per memory cell, or per column of n cells, or even a single device for a complete memory array. It is also possible to precharge $X_1$ and $X_2$ via $Q_5$ and $Q_6$ from the DATA and $\overline{\text{DATA}}$ lines (the latter two lines both being forced high). In such circumstances transistors $Q_7$ and $Q^8$ would be unnecessary and additional logic controlled by $\overline{\text{NVR}}$ would be needed to force DATA and $\overline{\text{DATA}}$ lines high.

Furthermore, in practice $Q_3$ and $Q_4$ may need to be provided with series and/or shunt transistors to maintain correct logic levels.

The cell shown in FIG. 1 has a CMOS configuration with FATMOS N channel drivers and with the nodes $X_1$, $X_2$ precharged positively. The converse configuration (with FATMOS P channel drivers) is also possible, with the nodes $X_1$, $X_2$ precharged negatively.

Figure 2:
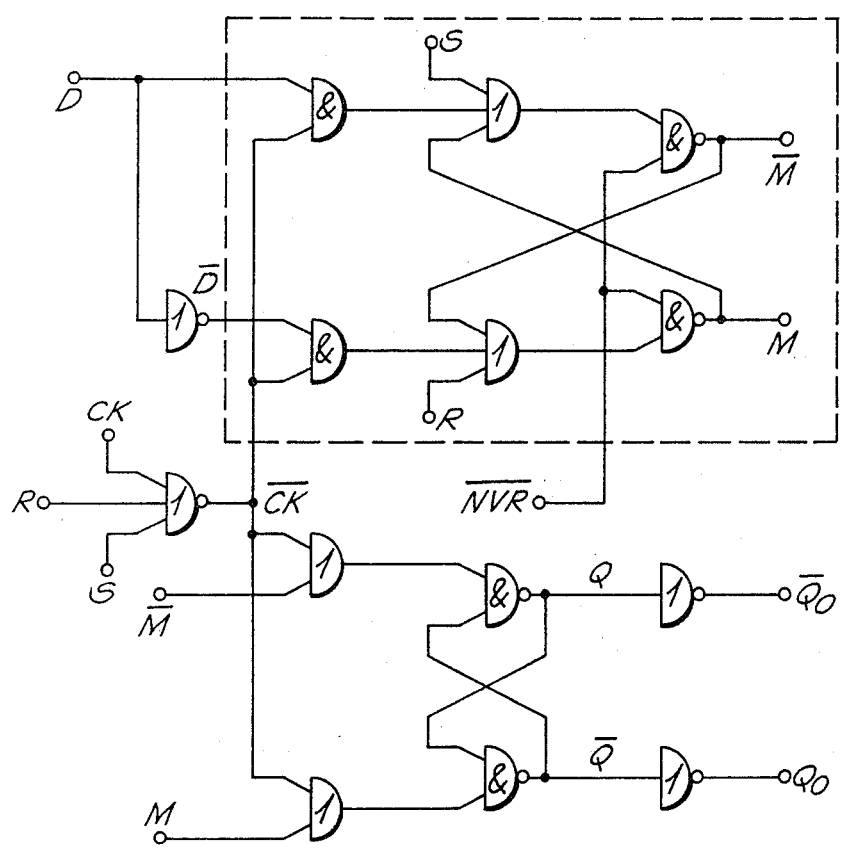
FIGS. 2 and 3 are circuit diagrams of a second embodiment of the invention.
Figure 3:
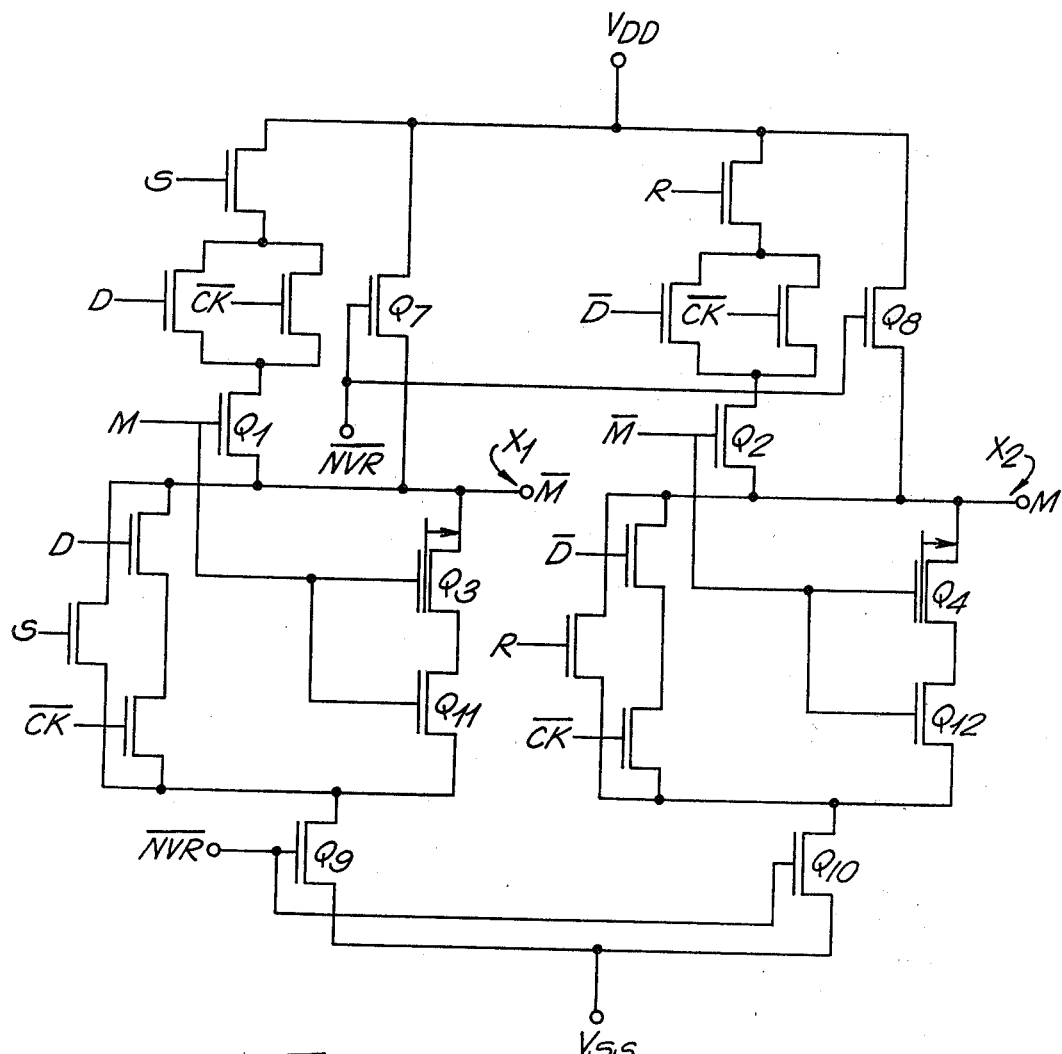

A second embodiment of the invention is illustrated in FIGS. 2 and 3, wherein a non-volatile read operation by means of the $\overline{\text{NVR}}$ signal is employed in a non-volatile D-type set-reset master-slave flip-flop. The logic circuit for the flip-flop is shown in FIG. 2 with the usual symbols for the AND, OR, NAND and NOR gates, and with the D-input signal D, set signal S, reset signal R, and clock signal CK. The master flip-flop is shown within the dashed box, supplying outputs M, $\overline{\text{M}}$ to the slave flip-flop below the dashed box. The latter flip-flop has outputs Q, $\overline{\text{Q}}$ which are inverted to provide final outputs $\overline{\text{Q}}_0$, $Q_0$.

Only the master flip-flop need be non-volatile and it receives the $\overline{\text{NVR}}$ signal for non-volatile reading as shown. The detailed circuit for the master flip-flop is shown in FIG. 3, and although it is drawn slightly differently from the latch shown in FIG. 1, it functions similarly thereto. It includes complementary drivers (or loads) $Q_1$, $Q_2$, FATMOS drivers $Q_3$, $Q_4$, and non-volatile read transistors $Q_7$ to $Q_{10}$. Load transistors $Q_{11}$, $Q_{12}$ are provided in series with the FATMOS drivers $Q_3$, $Q_4$. The various transistors to enable the flip-flop to function in a logically correct manner (e.g. with S or R signals) are also shown. During both reading and writing operations the clock input CK must be held low so that the data in the master flip-flop is transferred to the slave flip-flop.

To write non-volatile information into the D-type, the CK input is held low and $V_{DD}$ raised from its normal +5 volts to about +12 volts (typically for 50 μsec). This alters the thresholds of the FATMOS drivers $Q_3$, $Q_4$ as has been previously described in U.S. Pat. No. 4,132,904 and U.K. Patent Specification No. 2,000,407. To read this information out of the D-type, the $\overline{\text{NVR}}$ signal is applied as has previously been described for the FIG. 1 embodiment. Typically the $\overline{NVR}$ signal is about 5 volts negative for a few microseconds. The master flip-flop settles into a stable state dictated by the previous non-volatile write operation and this, with the clock input CK held low, is transferred to the slave flip-flop and presented as outputs $Q_0$, $\overline{Q_0}$. It will be appreciated that the non-volatile read operation causes the master flip-flop to settle into a logic state opposite to that written in during non-volatile writing.

I claim:

1. A non-volatile bistable semiconductor latch having a pair of cross-coupled branches connectable across a common supply voltage, each branch including a complementary driver or load and a driver connected in series at a respective node, at least one of said complementary drivers or loads, or drivers, including an insulated gate field effect transistor (IGFET) having a threshold voltage which may be varied by raising its gate potential above a predetermined level relative to the potential on one of its other electrodes, whereby volatile information stored in said latch is rendered non-volatile by increasing said gate potential above said predetermined level, and means for precharging both said nodes to an identical logic state such that, when the precharge signal is removed, at least one variable threshold IGFET switches in a direction to place the latch in the correct logic state dictated by an earlier non-volatile storing operation.

2. A latch according to claim 1 wherein one or both of said drivers include a said variable threshold IGFET.

3. A latch according to claim 2 wherein the or each variable threshold IGFET driver is an N-channel device.

4. A latch according to claim 1 wherein said complementary drivers or loads, and drivers, constitute a CMOS latch.

5. A latch according to claim 4 wherein said drivers include N-channel devices and said complementary drivers or loads include P-channel devices.

6. A latch according to claim 1 wherein said precharging means includes means to precharge both said nodes to a positive potential.

7. A latch according to claim 6 wherein said precharging means includes means to connect said nodes to the positive supply voltage of the latch.

8. A latch according to claim 6 wherein said precharging means includes means includes means to isolate said nodes from the negative supply voltage of the latch.

9. A latch according to claim 6 wherein said precharging means includes means to switch on said at least one variable threshold IGFET.

10. A latch according to claim 1 wherein said drivers include P-channel devices and said complementary drivers or loads include N-channel devices, and said precharging means includes means to precharge both said nodes to a negative potential.

11. A latch according to claim 1 wherein said precharging means includes a MOS transistor in parallel with the complementary driver or load in each branch of the latch.

12. A latch according to claim 11 wherein said precharging means includes a MOS transistor in series with the driver in each branch of the latch, between each said driver and a connection to the negative voltage supply for the latch.

13. A latch according to claim 12 wherein the said parallel transistors are of one conductivity type and said series transistors are of the opposite conductivity type.

14. A latch according to claim 11 wherein at least one of said drivers is a said variable threshold IGFET of N-channel conductivity.

15. A latch according to claim 14 wherein said parallel transistors are PMOS IGFET's.

16. A latch according to claim 1 wherein said precharging means includes means to precharge both said nodes to an identical logic state through $\overline{DATA}$ and DATA lines coupled thereto.

17. In a master-slave D-type flip-flop the improvement which comprises employing a latch as claimed in claim 1 as the master flip-flop.

* * * * *